(12) United States Patent
Nguyen et al.

(10) Patent No.: US 11,948,790 B2
(45) Date of Patent: *Apr. 2, 2024

(54) HEATER SUPPORT KIT FOR BEVEL ETCH CHAMBER

(71) Applicant: Applied Materials, Inc., Santa Clara, CA (US)

(72) Inventors: Tuan Anh Nguyen, San Jose, CA (US); Jeongmin Lee, San Ramon, CA (US); Anjana M. Patel, San Jose, CA (US); Abdul Aziz Khaja, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/124,705

(22) Filed: Dec. 17, 2020

(65) Prior Publication Data
US 2021/0143005 A1  May 13, 2021

Related U.S. Application Data

(63) Continuation of application No. 16/419,813, filed on May 22, 2019, now Pat. No. 10,903,066, which is a
(Continued)

(51) Int. Cl.
*H01L 21/02* (2006.01)
*B08B 7/00* (2006.01)
(Continued)

(52) U.S. Cl.
CPC ...... *H01L 21/02087* (2013.01); *B08B 7/0035* (2013.01); *H01J 37/3244* (2013.01);
(Continued)

(58) Field of Classification Search
CPC ........... H01L 21/02087; H01L 21/3065; H01L 21/67103; H01L 21/68735;
(Continued)

(56) References Cited

U.S. PATENT DOCUMENTS 4,506,336 A   3/1985  Hird
5,235,995 A   8/1993  Bergman et al.
(Continued)

FOREIGN PATENT DOCUMENTS

JP   2001523045 A   11/2001
JP   2006120876 A    5/2006
(Continued)

OTHER PUBLICATIONS

PCT/US2018/031311, International Search Report dated Aug. 31, 2018, 13 pages.
(Continued)

*Primary Examiner* — John Zimmermann
(74) *Attorney, Agent, or Firm* — Patterson + Sheridan, LLP

(57) ABSTRACT

Embodiments described herein generally relate to apparatuses for processing a substrate. In one or more embodiments, a heater support kit includes a heater assembly contains a heater plate having an upper surface and a lower surface, a chuck ring disposed on at least a portion of the upper surface of the heater plate, a heater arm assembly contains a heater arm and supporting the heater assembly, and a heater support plate disposed between the heater plate and the heater arm and in contact with at least a portion of the lower surface of the heater plate.

20 Claims, 15 Drawing Sheets

Related U.S. Application Data continuation-in-part of application No. 16/352,518, filed on Mar. 13, 2019, now Pat. No. 10,629,427, which is a continuation of application No. 15/654,444, filed on Jul. 19, 2017, now Pat. No. 10,276,364.

(60) Provisional application No. 62/503,193, filed on May 8, 2017.

(51) Int. Cl.
  *H01J 37/32* (2006.01)
  *H01L 21/3065* (2006.01)
  *H01L 21/67* (2006.01)
  *H01L 21/687* (2006.01)

(52) U.S. Cl.
  CPC .... *H01J 37/32715* (2013.01); *H01L 21/3065* (2013.01); *H01L 21/67069* (2013.01); *H01L 21/67103* (2013.01); *H01L 21/68785* (2013.01); *H01J 37/32357* (2013.01); *H01J 2237/334* (2013.01)

(58) Field of Classification Search
  CPC ......... H01L 21/68785; H01L 21/68792; H01L 21/263; H01J 37/32568
  See application file for complete search history.

(56) References Cited

U.S. PATENT DOCUMENTS

| | | |
|---|---|---|
| 5,994,678 A | 11/1999 | Zhao et al. |
| 6,034,863 A | 3/2000 | Marohl et al. |
| 6,364,949 B1 | 4/2002 | Or et al. |
| 6,478,924 B1 | 11/2002 | Shamouilian et al. |
| 6,591,850 B2 | 7/2003 | Rocha-Alvarez et al. |
| 8,197,636 B2 | 6/2012 | Shah et al. |
| 8,349,202 B2 | 1/2013 | Fang et al. |
| 8,371,567 B2 | 2/2013 | Angelov et al. |
| 8,388,853 B2 | 3/2013 | Koelmel et al. |
| 8,562,750 B2 | 10/2013 | Chen et al. |
| 8,580,078 B2 | 11/2013 | Bailey, III et al. |
| 9,312,154 B2 | 4/2016 | Tran et al. |
| 9,478,428 B2 | 10/2016 | Berkoh et al. |
| 9,711,364 B2 | 7/2017 | Berkoh et al. |
| 9,721,782 B2 | 8/2017 | Chen et al. |
| 9,905,484 B2 | 2/2018 | Berkoh et al. |
| 10,074,555 B2 | 9/2018 | Koelmel et al. |
| 10,083,838 B2 | 9/2018 | Berkoh et al. |
| 10,276,364 B2 | 4/2019 | Su et al. |
| 10,453,697 B2 | 10/2019 | Berkoh et al. |
| 10,629,427 B2 | 4/2020 | Su et al. |
| 10,937,634 B2 | 3/2021 | Chen et al. |
| 2005/0109276 A1 | 5/2005 | Iyer et al. |
| 2007/0158305 A1 | 7/2007 | Cooke et al. |
| 2008/0173401 A1 | 7/2008 | Jeon |
| 2009/0017635 A1 | 1/2009 | Shah et al. |
| 2010/0200545 A1 | 8/2010 | Koelmel et al. |
| 2010/0294199 A1 | 11/2010 | Tran et al. |
| 2011/0085299 A1 | 4/2011 | Mizunaga et al. |
| 2011/0146703 A1 | 6/2011 | Chen et al. |
| 2011/0232566 A1 | 9/2011 | Chen et al. |
| 2012/0074099 A1 | 3/2012 | Fang et al. |
| 2012/0083129 A1 | 4/2012 | Berkoh et al. |
| 2013/0025538 A1 | 1/2013 | Collins et al. |
| 2013/0316516 A1 | 11/2013 | Deguchi |
| 2013/0334199 A1 | 12/2013 | Yousif et al. |
| 2015/0099365 A1 | 4/2015 | Chen et al. |
| 2015/0376780 A1 | 12/2015 | Khaja et al. |
| 2015/0380220 A1* | 12/2015 | Tan ................... H01J 37/32715 219/443.1 |
| 2016/0053401 A1* | 2/2016 | Fu ........................... C30B 13/28 117/39 |
| 2016/0315021 A1 | 10/2016 | Berkoh et al. |
| 2017/0092511 A1 | 3/2017 | Basu et al. |
| 2017/0182576 A1* | 6/2017 | Teraoka ............... F16M 11/041 |
| 2017/0213758 A1 | 7/2017 | Rice et al. |
| 2017/0250060 A1* | 8/2017 | Lubomirsky ..... H01L 21/67103 |
| 2018/0061651 A1 | 3/2018 | Berkoh et al. |
| 2018/0214915 A1 | 8/2018 | Butterbaugh |
| 2018/0218933 A1 | 8/2018 | Luere et al. |
| 2018/0323062 A1 | 11/2018 | Su et al. |
| 2019/0131167 A1 | 5/2019 | Rice et al. |
| 2019/0272991 A1 | 9/2019 | Nguyen et al. |

FOREIGN PATENT DOCUMENTS

| | | |
|---|---|---|
| JP | 2007214588 A | 8/2007 |
| JP | 201460440 A | 4/2014 |
| JP | 2014222786 A | 11/2014 |
| KR | 20010101716 A | 11/2001 |
| KR | 20060118970 A | 11/2006 |
| KR | 20100063005 A | 6/2010 |
| KR | 20140012679 A | 2/2014 |
| KR | 20150040247 A | 4/2015 |
| KR | 20160001685 A | 1/2016 |
| KR | 20180085819 A | 7/2018 |

OTHER PUBLICATIONS

International Search Report and Written Opionon dated Aug. 31, 2018 for Application No. PCT/US2018/031311.
International Search Report and Written Opinion dated Jun. 12, 2020 for Application No. PCT/US2020/019150.
Korean Office Action dated May 26, 2021 for Application No. 10-2019-7036062.
Chinese Office Action dated Jan. 13, 2023 for Application No. 201880030307.2.
Japanese Office Action dated May 10, 2022 for Application No. 2019-560643.
Singapore Search Report and Written Opinion dated Jul. 11, 2023 for Application No. 11202112734V.
Korean Office Action dated Sep. 22, 2023 for Application No. 10-2021-7041753.

\* cited by examiner

HEATER SUPPORT KIT FOR BEVEL ETCH CHAMBER

CROSS-REFERENCE TO RELATED APPLICATIONS

This application is a continuation of U.S. application Ser. No. 16/419,813, filed May 22, 2019, which is a continuation-in-part of U.S. application Ser. No. 16/352,518, filed Mar. 13, 2019, now issued as U.S. Pat. No. 10,629,427, which is a continuation of U.S. application Ser. No. 15/654,444, filed Jul. 19, 2017, now issued as U.S. Pat. No. 10,276,364, which claims benefit of U.S. Prov. Appl. No. 62/503,193, filed May 8, 2017, which are herein incorporated by reference in their entireties.

BACKGROUND OF THE DISCLOSURE

Field of the Disclosure

Embodiments described herein generally relate to methods and apparatus for processing a substrate. More particularly, embodiments described herein relate to heater support kits for bevel etch chambers.

Description of the Related Art

Plasma processing is commonly used for many semiconductor fabrication processes for manufacturing integrated circuits, flat-panel displays, magnetic media, and other devices. A plasma, or ionized gas, is generated inside a remote plasma source (RPS) and flows into a processing chamber and then applied to a workpiece to accomplish a process such as deposition, etching, or implantation. Processing is generally accomplished by introducing a precursor gas or gas mixture into a vacuum chamber that contains a substrate. During the deposition or etching processes, a component, such as a mask or showerhead, may be located opposite the substrate. The precursor gas or gas mixture in the chamber is energized (e.g., excited) into a plasma by using an RPS. The excited gas or gas mixture reacts to selectively etch a layer of film on an edge of the substrate.

However, the beveled edges of the substrate, such as sides and corners thereof, experience conditions that may be different than the conditions experienced at other portions of the substrate. These different conditions affect processing parameters such as film thickness, etch uniformity, and/or film stress. The difference of etch rate and/or film property, such as film thickness or stress, between the center and the edges of the substrate becomes significant and may result in devices with suboptimal characteristics.

Therefore, what is needed in the art is an improved apparatus for bevel etch processing.

SUMMARY OF THE DISCLOSURE

Embodiments described herein generally relate to apparatuses for processing a substrate. In one or more embodiments, a heater support kit includes a heater assembly, a chuck ring, a heater arm assembly, and a heater support plate. The heater assembly contains a heater plate having an upper surface and a lower surface. The chuck ring is disposed on at least a portion of the upper surface of the heater plate. The heater arm assembly contains a heater arm and supports the heater assembly. The heater support plate is disposed between the heater plate and the heater arm and in contact with at least a portion of the lower surface of the heater plate. In other embodiments, the heater support kit also includes a lower support plate disposed below the heater support plate and a centering plug disposed below the lower support plate.

In one or more embodiments, a method for bevel etch processing includes placing a substrate on a substrate support inside of a processing chamber, the substrate having a deposition layer, which includes a center, and a bevel edge. A mask is placed over the substrate. The edge ring is disposed around the substrate and on a substrate support. The method also includes flowing a process gas mixture to etch adjacent the bevel edge, and flowing a purge gas through a first hole, a second hole, and a third hole of the mask in the center of the substrate adjacent a top of the substrate.

In other embodiments, a method includes placing a substrate on a substrate support inside of a processing chamber, the substrate having a deposition layer, which includes a center, and a bevel edge. A mask is placed over the substrate. The edge ring is disposed under the substrate and on a substrate support. The method also includes raising the edge ring to contact the mask. The method also includes flowing a process gas mixture adjacent the bevel edge, and flowing a purge gas through a first hole, a second hole, and a third hole of the mask in the center of the substrate adjacent a top of the substrate.

In some embodiments, a method includes placing a substrate on a substrate support inside of a processing chamber, the substrate having a deposition layer, which includes a center, and a bevel edge. A mask is placed over the substrate. The edge ring is disposed around the substrate and on a substrate support. The method also includes flowing a process gas mixture adjacent the bevel edge, and flowing a purge gas through a first hole, a second hole, and a third hole of the mask in the center of the substrate adjacent a top of the substrate. The process gas includes one or more of nitrogen ($N_2$), oxygen ($O_2$), nitrogen trifluoride ($NF_3$), argon, helium, or any combination thereof.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Embodiments described herein generally relate to methods and apparatus for processing a substrate. More particularly, embodiments described herein relate to methods and an apparatus for bevel etch processing. In some embodiments, a method of cleaning a bevel edge of a semiconductor substrate is provided. The method includes placing a substrate on a cover plate inside of a processing chamber, the substrate having a deposition layer, which includes a center, and a bevel edge. A mask is placed over the substrate. The edge ring is disposed around/under the substrate. The method also includes flowing a process gas mixture adjacent the bevel edge, and flowing a purge gas through a first hole, a second hole, and a third hole of the mask in the center of the substrate adjacent a top of the substrate.

Figure 1:
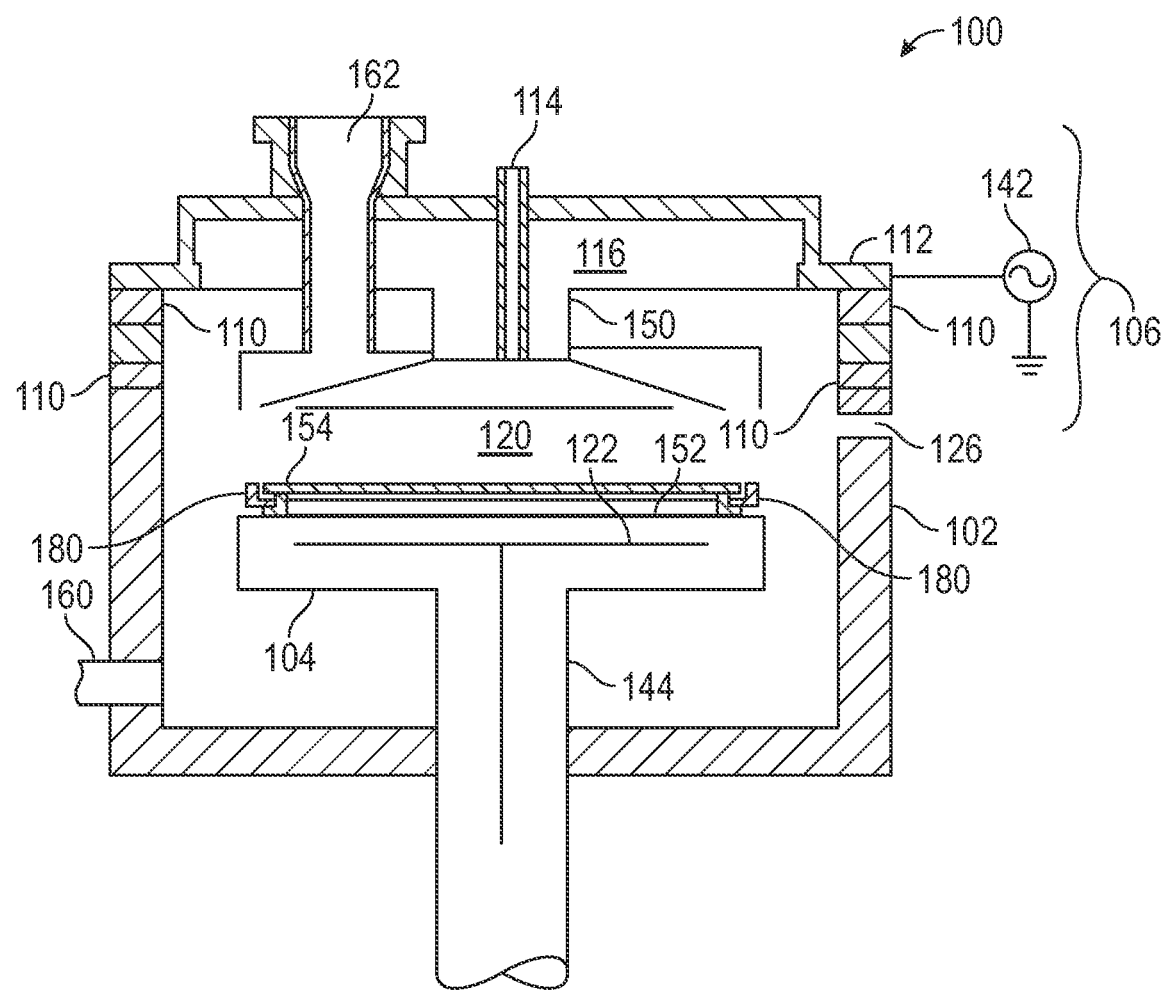
FIG. 1 depicts a schematic cross-sectional view of a processing chamber 100, according to one or more embodiments described and discussed herein.

FIG. 1 illustrates a schematic cross-sectional diagram of a processing chamber 100, according to one aspect of the disclosure. As shown, the processing chamber 100 is an etch chamber suitable for etching a substrate, such as substrate 154. Examples of processing chambers that may be adapted to benefit from exemplary aspects of the disclosure are Producer® Processing Chamber, and Precision™ Processing Chamber, commercially available from Applied Materials, Inc., located in Santa Clara, California. It is contemplated that other processing chambers, including those from other manufacturers, may be adapted to benefit from aspects of the disclosure.

The processing chamber 100 may be used for various plasma processes. In one aspect, the processing chamber 100 may be used to perform dry etching with one or more etching agents. For example, the processing chamber may be used for ignition of plasma from one or more fluorocarbons (e.g., carbon tetrafluoride, hexafluoroethane, and others), nitrogen ($N_2$), oxygen ($O_2$), nitrogen trifluoride ($NF_3$), or combinations thereof. In another embodiment the processing chamber 100 may be used for plasma enhanced chemical vapor deposition with one or more chemical agents.

The processing chamber 100 includes a chamber body 102, a lid assembly 106, a support assembly 104, and a gas outlet 160. The lid assembly 106 is positioned at an upper end of the chamber body 102. The lid assembly 106 and support assembly 104 of FIG. 1 may be used with any processing chamber for plasma or thermal processing. Chambers from other manufacturers may also be used with the components described above. The support assembly 104 is disposed inside the chamber body 102, and a lid assembly 106 coupled to the chamber body 102 and enclosing the support assembly 104 in a processing volume 120. The chamber body 102 includes a slit valve opening 126 formed in a sidewall thereof. The slit valve opening 126 is selectively opened and closed to allow access to the interior volume 120 by a substrate handling robot (not shown) for substrate transfer.

An isolator 110, which may be a dielectric material such as a ceramic or metal oxide, for example aluminum oxide and/or aluminum nitride, contacts the electrode and separates the electrode electrically and thermally from a gas distributor 112 and from the chamber body 102. The gas distributor 112 features openings for admitting process gas into the processing volume 120. The process gases may be supplied to the processing chamber 100 via a conduit 114, and the process gases may enter a gas mixing region 116 prior to flowing through the openings to the substrate 154. The gas distributor 112 may be connected to an RPS.

The support assembly 104 may be any suitable substrate support, such as a vacuum chuck, an electrostatic chuck, or a heated pedestal. In one or more embodiments, the substrate support is an "L" shaped pedestal to save space for load lock installation. The support assembly has a vacuum chuck line, a heating line and a TC that probes support assembly temperature. In some embodiments, the substrate support 104 is configured to support the substrate 154 for processing. The lift mechanism allows the substrate support 104 to be moved vertically within the chamber body 102 between a lower transfer position and a number of raised process positions. The support assembly 104 may be formed from a metallic or ceramic material, for example a metal oxide or nitride or oxide/nitride mixture such as aluminum, aluminum oxide, aluminum nitride, or an aluminum oxide/nitride mixture. A heater 122 may be coupled to the support assembly 104. The heater 122 may be embedded within the support assembly 104 or coupled to a surface of the support assembly 104. The heater 122 may be coupled to a power source extending exterior the chamber 100.

Figure 2:
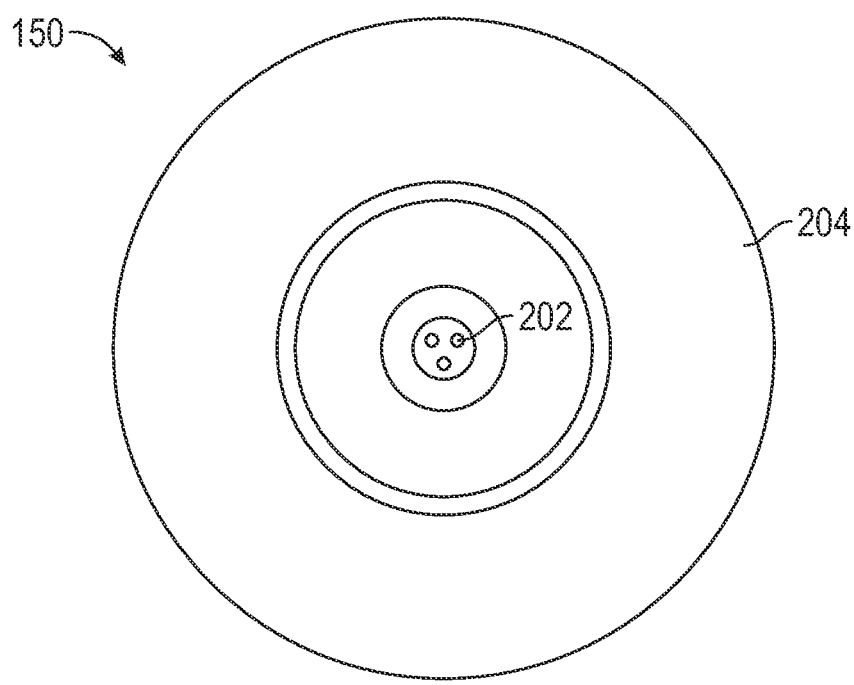
FIG. 2 depicts a schematic bottom view of a mask utilized in the chamber of FIG. 1, according to one or more embodiments described and discussed herein.

A reactant blocker or mask 150 may be part of the lid assembly 106, or may be a separate detachable piece. The mask 150 has a dome shape body 204 with a flattened bottom surface. As shown in FIG. 2, the mask 150 has circular aperture. At the center of the aperture are three openings 202 to create a small choke ensuring uniform distribution of purge gas in all directions. In some embodiments, the three openings 202 may be of uniform size and shape and spaced equidistant. The mask 150 may be lowered to contact a substrate 154. The mask 150 may be quartz or other ceramic material, and may be coated with Ni or NiO, if desired, or a chemically resistant or plasma resistant material, such as yttria or yttrium oxide, in some embodiments. The lid assembly 106 further includes a plasma source 162. The plasma source 162 is adjacent the mask 150.

Figure 3:
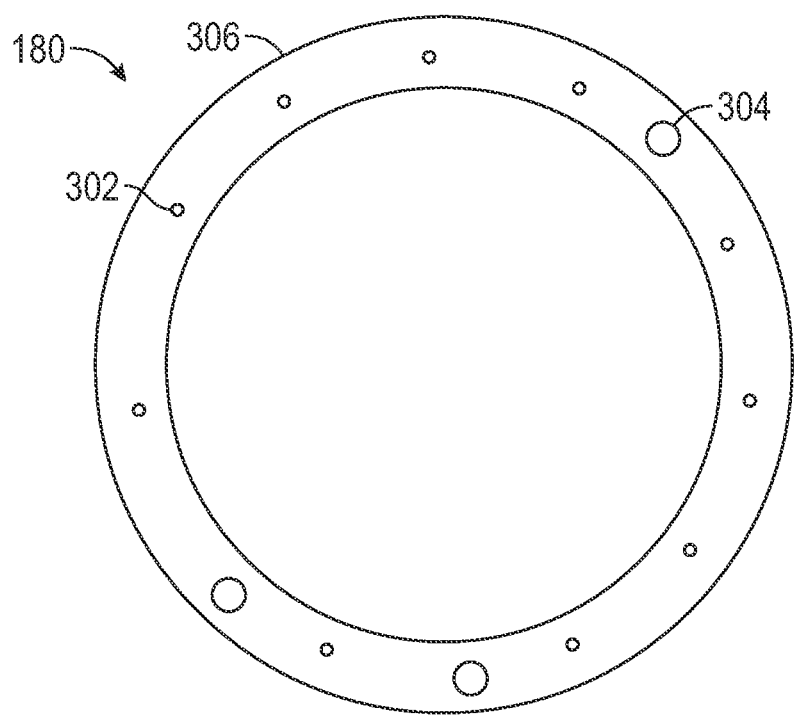
FIG. 3 depicts a schematic bottom view of an edge ring utilized in the chamber of FIG. 1, according to one or more embodiments described and discussed herein.

FIG. 3 illustrates a schematic top view of an edge ring 180 utilized in the chamber of FIG. 1, according to one aspect of the disclosure. In some embodiments, the edge ring 180 is disposed adjacent to the contact the mask 150. The edge ring 180 has an annular body 306. The edge ring 180 includes several openings 304 for engaging the substrate assembly 104. The edge ring 180 is disposed on the substrate assembly 104. In some embodiments, the edge ring 180 may be disposed adjacent to a cover plate 152. The edge ring 180 may comprise a ceramic material, such as quartz or alumina. The edge ring 180 has a plurality of protrusions 302. The protrusions 302 may be circular bumps, square, rectangular, hexagonal, or any other shape. The protrusions 302 are arranged around the body 306. Ten protrusions 302 are shown, however, there may be more or less protrusions 302. The protrusions may be equally spaced around the circumference of the body 306 of the edge ring 180. In some embodiments, the protrusions 302 reduce heat transfer from the substrate assembly 104 and the substrate 154. Additionally, the edge ring 180 provides a pressure differential between the top of the substrate and the bottom of the substrate 154. In some embodiments, the edge ring 180 provides for a uniform leveling above the substrate 154.

Figure 4:
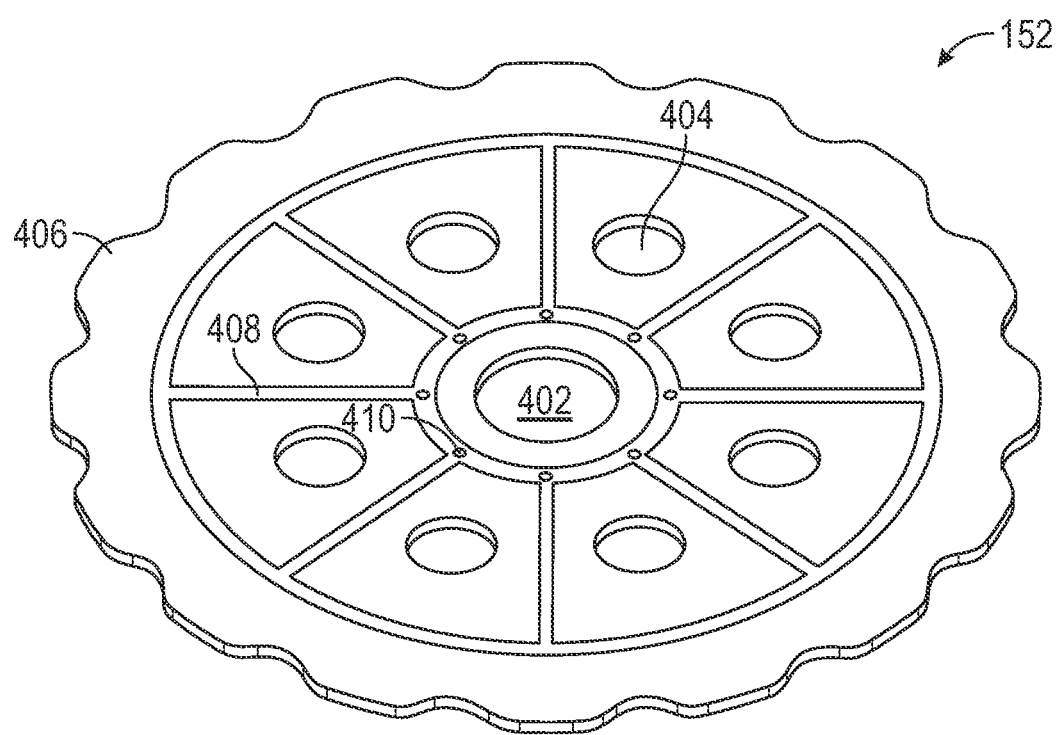
FIG. 4 depicts a schematic top view of a cover plate utilized in the chamber of FIG. 1, according to one or more embodiments described and discussed herein.

FIG. 4 illustrates a schematic top view of a cover plate 152 utilized in the chamber of FIG. 1, according to one aspect of the disclosure. The cover plate 152 includes a central aperture 402, a plurality of openings 404, a plurality of fasteners 410, a scalloped edge 406, and a plurality of spokes 408. The central aperture 402 may be a circular opening, a hexagonal opening, a rectangular opening, or any other shaped opening. The plurality of openings 404 are circular openings displaced circumferentially around the central aperture 402. Each of the plurality of openings 404 is smaller than the central aperture 402. Although the present disclosure shows eight openings 404, the plurality of openings 404 can include more or less than eight openings 404. In some embodiments, the openings 404 are evenly spaced around the central aperture 402. In other embodiments, the distances between the openings 404 are varied. The plurality of spokes 408 are grooves in the cover plate 152. The plurality of spokes 408 radiate out from a circular groove that encircles the central aperture 402. The plurality of spokes 408 are linear grooves that extend radially outward towards the scalloped edge 406. The scalloped edge 406 includes a wave-like pattern with uniform indentions. The scalloped edge 406 may have rounded edges, square edges, or pointed edges. The scalloped edge 406 prevents substrate sliding when placing onto the cover plate 152 and chuck ring 180.

In operation, a method of etching a substrate begins by placing a substrate on a substrate support inside of a processing chamber. After undergoing a deposition process in the same chamber or in a different chamber, the substrate has a dielectric layer, a center, and a bevel edge. The mask 150 is lowered over the substrate 154 to maintain a small gap between a mask and a substrate between 0.003 inch and 0.100 inch. In one or more embodiments, the substrate 154 and the edge ring 180 are raised to contact the mask 150. In some embodiments, the distance between the substrate 154 and the mask 150 is less than 100 mil. In some embodiments, the distance between the substrate 154 and the mask 150 is about 10 mil. In other embodiments, the distance between the substrate 154 and the mask 150 is less than 100 mil, such as between 5 mil and 20 mil. The edge ring 180 is disposed around/under the substrate 154. In other embodiments, the edge ring 180 is disposed around the cover plate 152. In other embodiments, the edge ring 180 is disposed over the substrate assembly 104. The method continues by flowing a process gas mixture adjacent a top of the substrate 154 and adjacent the bevel edge. The process gas may be any number of etchant gases. The process gas etches the bevel edge. The process gas can include one or more of nitrogen ($N_2$), oxygen ($O_2$), nitrogen trifluoride ($NF_3$), argon, helium, or any combination thereof. The method further includes flowing a purge gas through the three openings 202 of the mask 150 about the center of the substrate 154.

By flowing the etchant gas at a first location and the purge gas at a second location, a more uniform and controlled etch can be achieved. Additionally, the various openings in the mask create a small flow choke and ensure uniform distribution of the purge gas in all directions. Finally, the scalloped cover plate provides stability during substrate placement and pick up.

Figure 5:
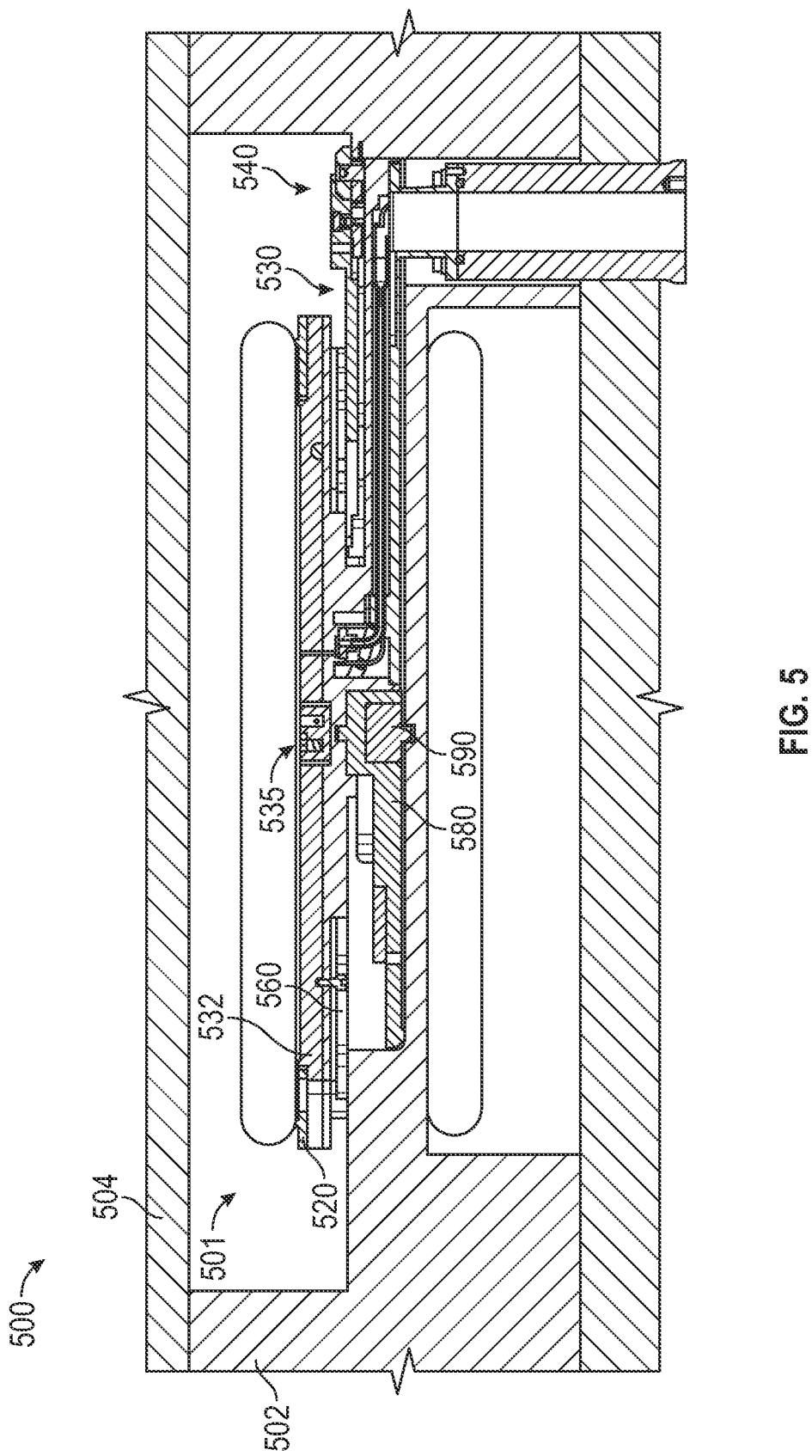
FIG. 5 depicts a schematic cross-sectional view of a processing chamber containing a heater support kit, according to one or more embodiments described and discussed herein.

FIG. 5 depicts a schematic cross-sectional view of a processing chamber 500 containing a heater support kit 501, according to one or more embodiments described and discussed herein. The processing chamber 500 can have the components and/or be configured the same as the processing chamber 100, described and discussed above. Alternatively, the process kit or components in the processing chamber 100 can be replaced with the heater support kit 501 and/or components or parts thereof. The processing chamber also includes a chamber body 502 and a chamber lid 504.

In one or more embodiments, a heater support kit 501 includes a chuck ring 520, a heater assembly 530, a heater arm assembly 540, a heater support plate 560, a lower support plate 580, and a centering plug 590, as depicted in FIG. 5.

Figure 6:
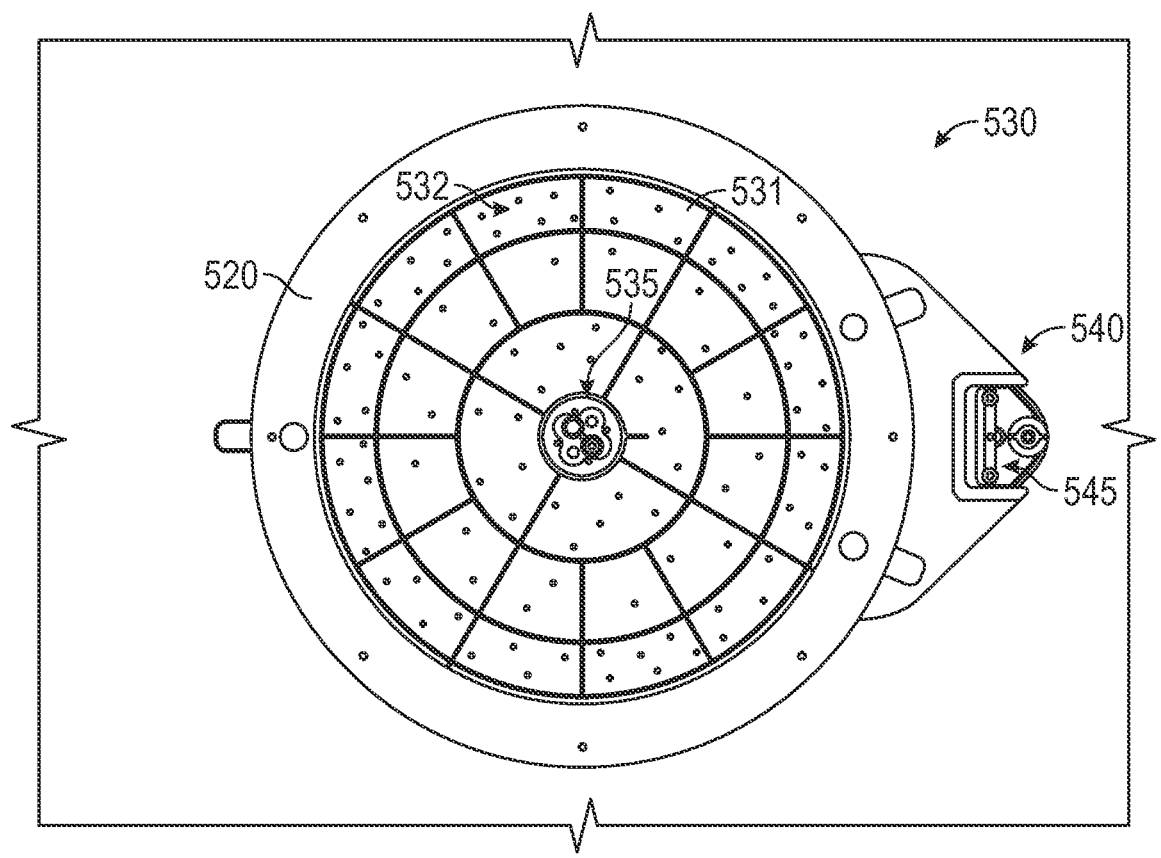
FIG. 6 depicts a schematic top view of the heater support kit shown in FIG. 5, according to one or more embodiments described and discussed herein.
Figure 7:
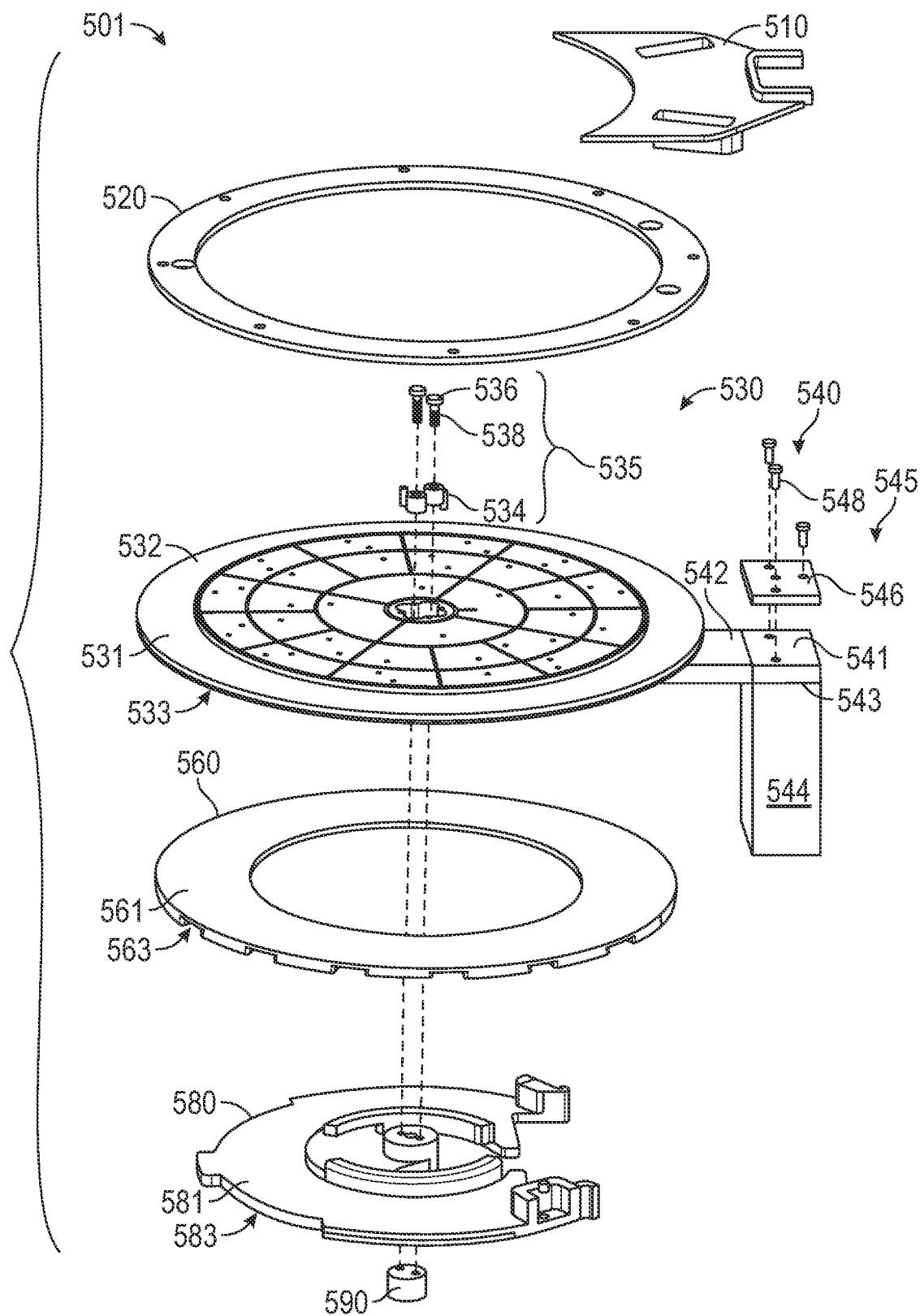
FIG. 7 depicts a schematic exploded view of the heater support kit shown in FIG. 5, according to one or more embodiments described and discussed herein.

FIG. 6 depicts a schematic top view of the heater support kit 501 and FIG. 7 depicts a schematic exploded view of the heater support kit 501, according to one or more embodiments described and discussed herein. In some embodiments, the heater assembly 530 contains a heater plate 532 having an upper surface 531 and a lower surface 533 and the chuck ring 520 is disposed on at least a portion of the upper surface 531 of the heater plate 532. The heater arm assembly 540 contains a heater arm 542 and supporting the heater assembly 530. The heater arm assembly 540 also contains a heater cooling shaft 544 coupled to a lower surface of the heater arm 542. The heater support plate 560 is disposed between the heater plate 532 and the heater arm 542 and in contact with at least a portion of the lower surface 533 of the heater plate 532.

The heater support kit 501 includes a lower support plate 580 disposed below the heater support plate 560. The heater support kit 501 includes a centering plug 590 disposed below the lower support plate 580. The centering plug 590 can be coupled or attached to the chamber body 502. The lower support plate 580 contains or includes one or more materials, such as steel, stainless steel, iron, chromium, nickel, aluminum, alloys thereof, or any combination thereof. The heater support kit 501 further includes a pumping plate 510 coupled to the heater arm assembly 540, as shown in FIG. 7.

In other embodiments, the heater support kit 501 includes a heater assembly 530 contains a heater plate 532 having an upper surface 531 and a lower surface 533, a chuck ring 520 disposed on at least a portion of the upper surface 531 of the heater plate 532, a heater arm assembly 540 contains a heater arm 542 and supporting the heater assembly 530, and a heater support plate 560 disposed between the heater plate 532 and the heater arm 542 and in contact with at least a portion of the lower surface 533 of the heater plate 532. The heater support kit 501 also includes a lower support plate 580 disposed below the heater support plate 560 and a centering plug 590 disposed below the lower support plate 580.

Figure 8:
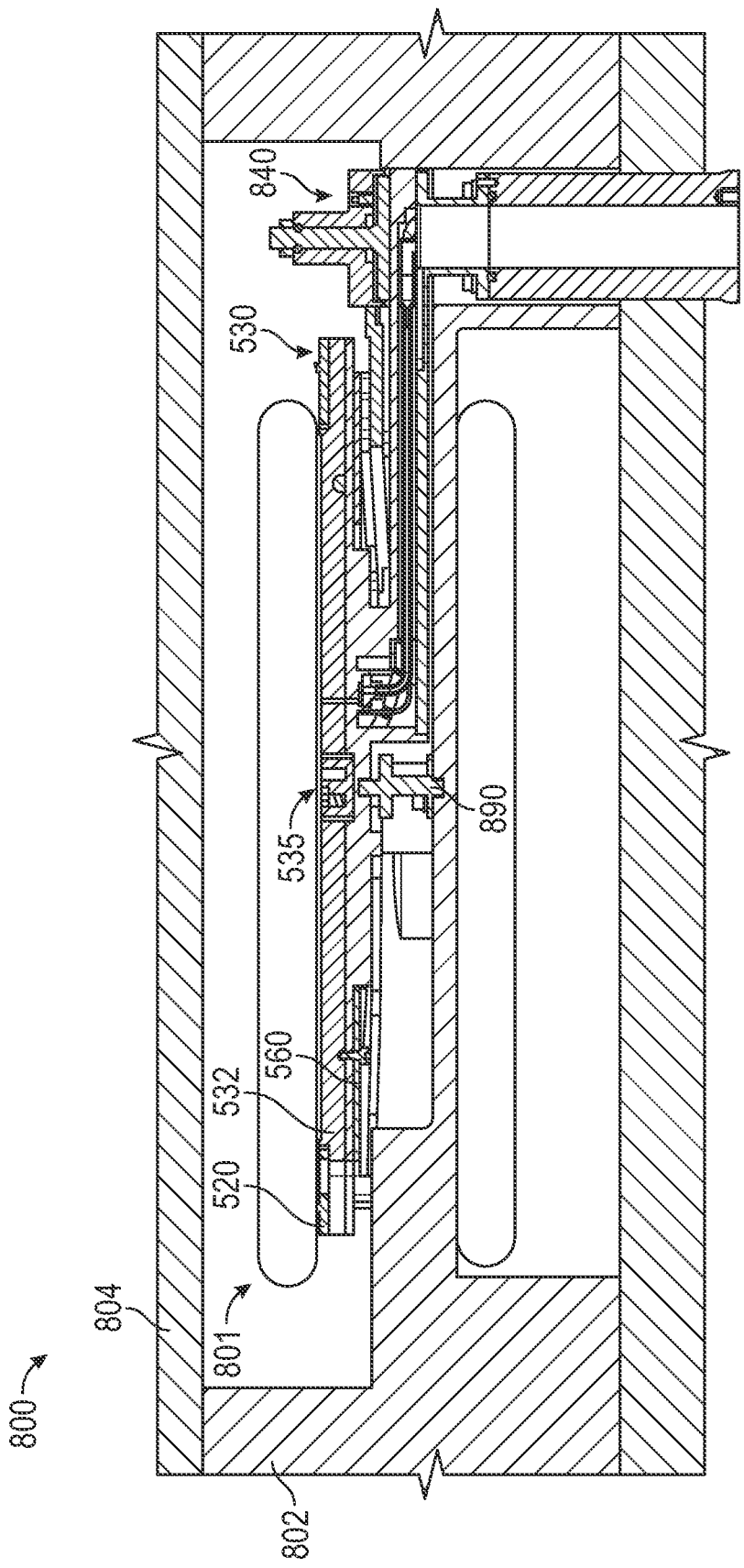
FIG. 8 depicts a schematic cross-sectional view of a processing chamber containing another heater support kit, according to one or more embodiments described and discussed herein.

FIG. 8 depicts a schematic cross-sectional view of a processing chamber 800 containing a heater support kit 801, according to one or more embodiments described and discussed herein. The processing chamber 800 can have the components and/or be configured the same as the processing chamber 100, described and discussed above. Alternatively, the process kit or components in the processing chamber 100 can be replaced with the heater support kit 801 and/or components or parts thereof. The processing chamber also includes a chamber body 802 and a chamber lid 804.

Figure 9:
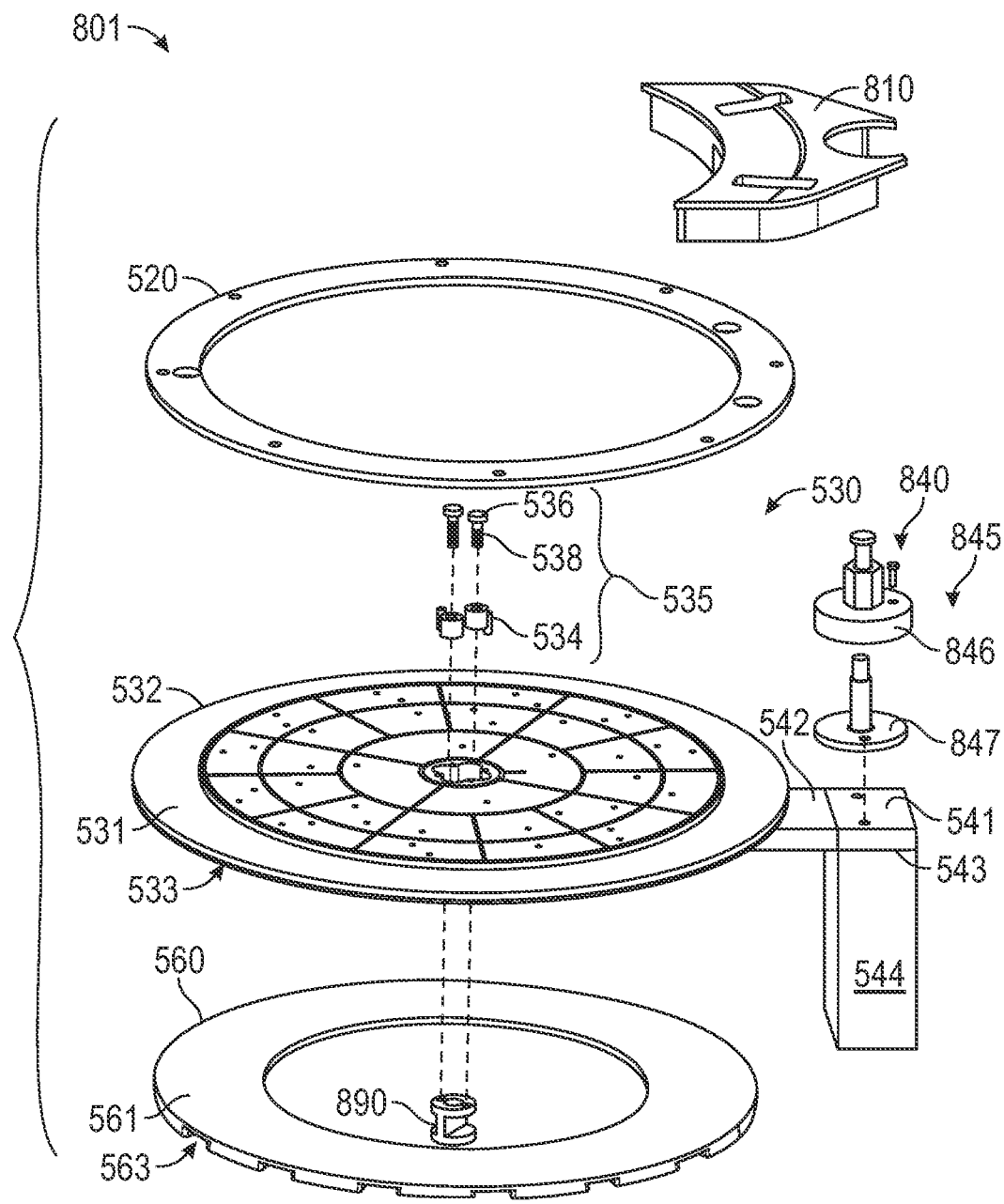
FIG. 9 depicts a schematic exploded view of the heater support kit shown in FIG. 8, according to one or more embodiments described and discussed herein.

In one or more embodiments, the heater support kit 801 includes a chuck ring 520, the heater assembly 530, a heater arm assembly 840, the heater support plate 560, and a centering plug 890, as depicted in FIG. 8. FIG. 9 depicts a schematic exploded view of the heater support kit 801, according to one or more embodiments described and discussed herein.

In other embodiments, the heater support kit 801 also includes a centering plug 890 disposed below the heater support plate 560. The centering plug 890 can be coupled or attached to the chamber body 802. The heater support kit 801 further includes a pumping plate 810 coupled to the heater arm assembly 840, as shown in FIG. 9. The heater arm assembly 840 contains a cleat assembly 845 and the heater cooling shaft 544. The cleat assembly 845 can include a cleat 846 and a spindle 847. The cleat 846 can rotate around the spindle 847 and can engage and disengage the spindle 847 while reducing or eliminating any space or gap between the chamber components (e.g., the chamber body 802 and/or the chamber lid 804) and/or the cleat 846.

In some embodiments, the heater support kit 801 includes a heater assembly 530 contains a heater plate 532 having an upper surface 531 and a lower surface 533, a chuck ring 520 disposed on at least a portion of the upper surface of the heater plate 532, and a heater arm assembly 540 contains a heater arm 542 and supporting the heater assembly 530. The heater support kit 801 also includes a heater support plate 560 disposed between the heater plate 532 and the heater arm 542 and in contact with at least a portion of the lower surface of the heater plate 532 and a centering plug 890 disposed below the heater support plate 560.

Figure 10:
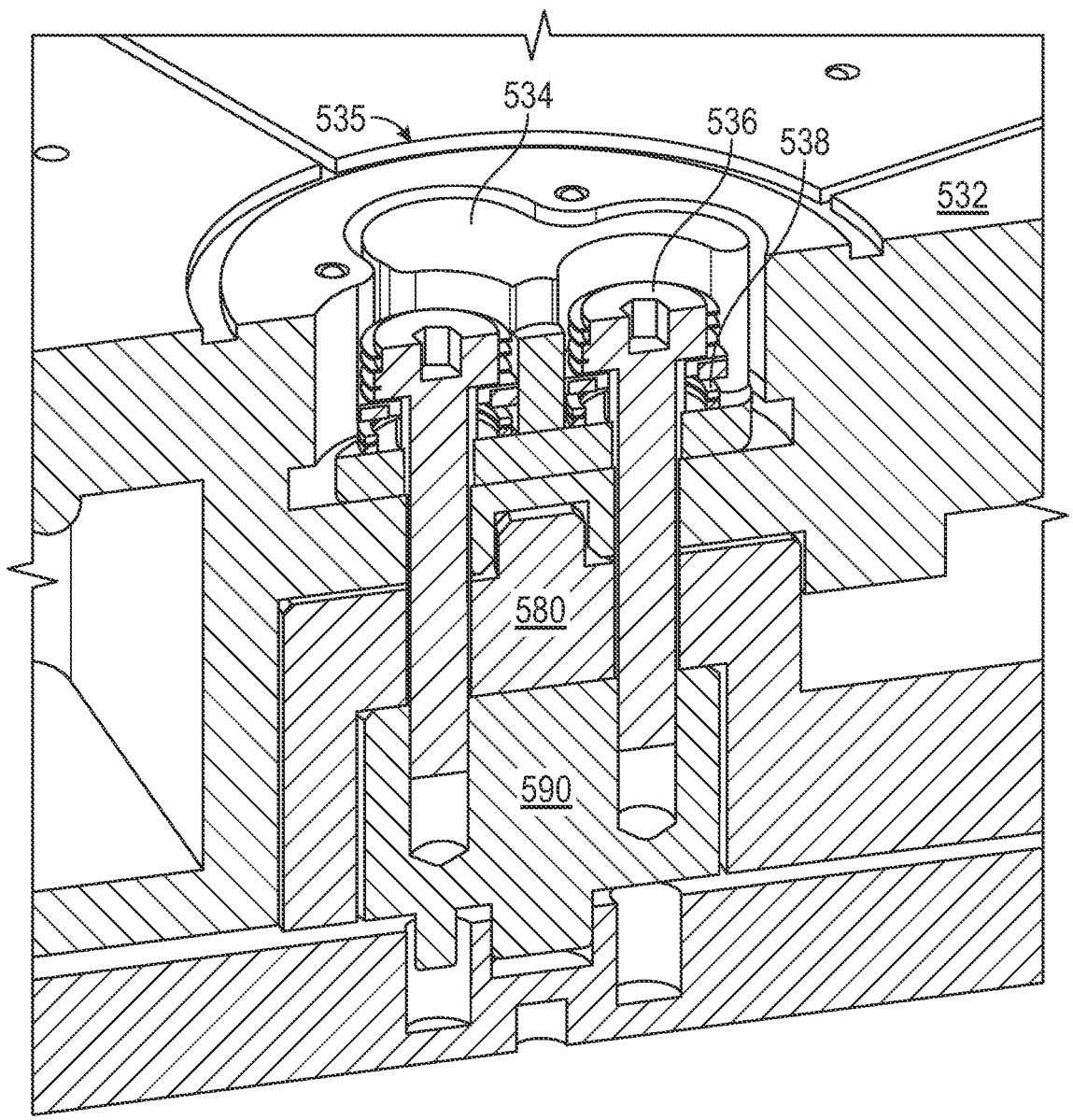
FIG. 10 depicts a schematic cross-sectional view of an attachment assembly, according to one or more embodiments described and discussed herein.

FIG. 10 depicts a schematic cross-sectional view of an attachment assembly 535, according to one or more embodiments described and discussed herein. The attachment assembly 535 can be contained and used on either of the heater support kits 501, 801. The attachment assembly 535 includes an attachment assembly 535 coupling together the heater plate 532 and the centering plug 590, 890. The attachment assembly 535 contains a clamping plug 534, one or more fasteners 536, and one or more actuating devices 538. In some examples, the attachment assembly 535 contains two or more fasteners 536 and two or more actuating devices 538. The fastener 536 can be or include a bolt, a screw, or the like. The actuating device 538 contains one or more springs. In some examples, the actuating device 538 is one or more wave springs. The one or more actuating devices 538 can be used to produce load for controlling pre-loading forces when assembling the heater support kits 501, 801.

Figure 11:
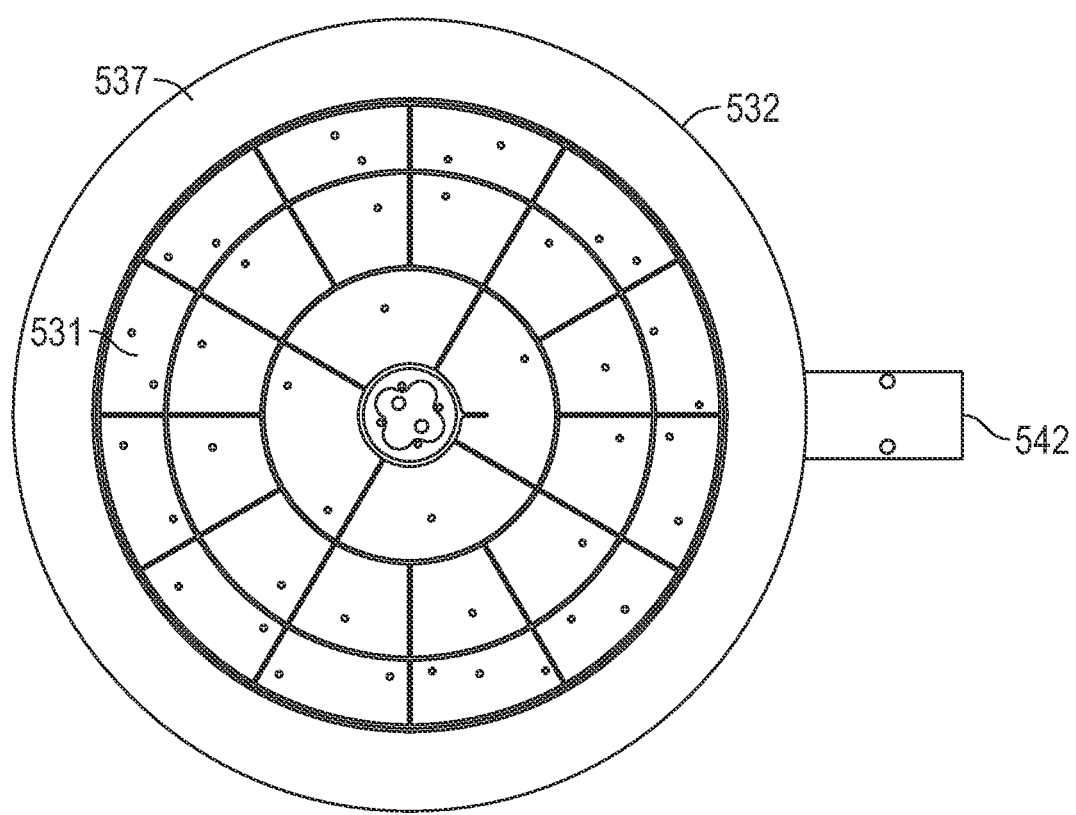
FIG. 11 depicts a schematic top view of a heater assembly, according to one or more embodiments described and discussed herein.
Figure 12:
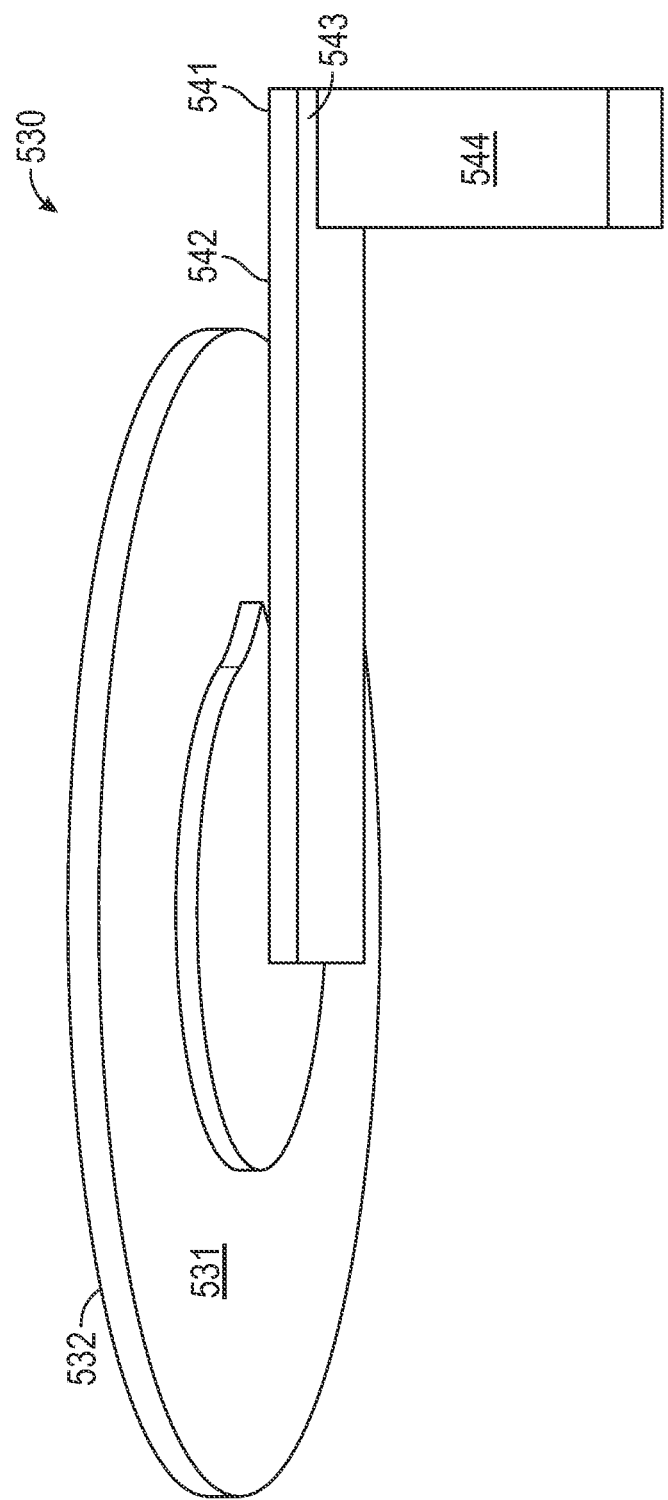
FIG. 12 depicts a schematic perspective view of the heater assembly shown in FIG. 11, according to one or more embodiments described and discussed herein.

FIG. 11 depicts a schematic top view of the heater assembly 530 and FIG. 12 depicts a schematic perspective view of the heater assembly 530, according to one or more embodiments described and discussed herein. The heater plate 531 can include can include a groove 537 circumventing the outer side portion of the heater plate 531. The chuck ring 520 can be positioned on the groove 537, as shown in the Figures. The heater plate 531 can include one or more materials, such as aluminum, aluminum alloy, titanium, steel, stainless steel, alloys thereof, or any combination thereof.

Figure 13A:
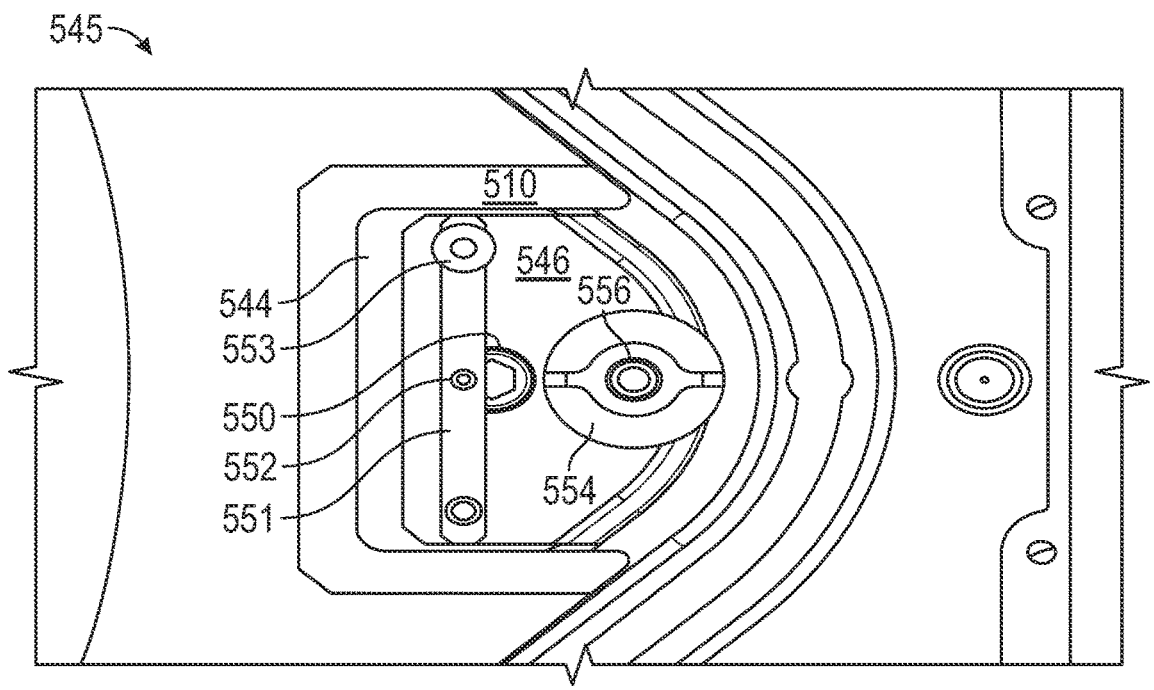
FIGS. 13A-13C depict schematic views of a cleat assembly, according to one or more embodiments described and discussed herein.
Figure 13B:
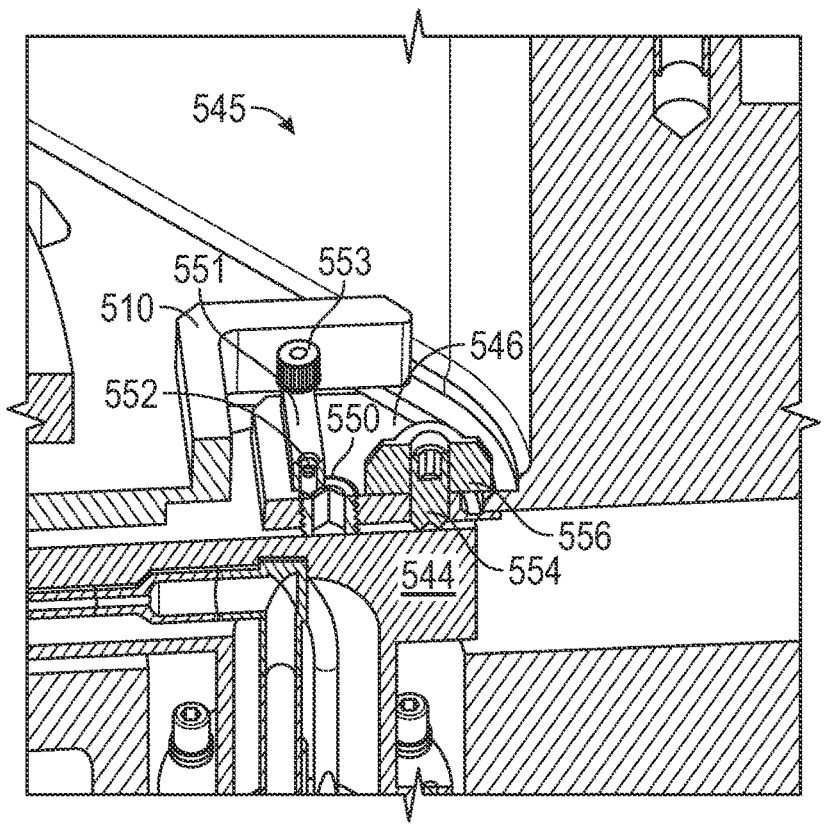
Figure 13C:
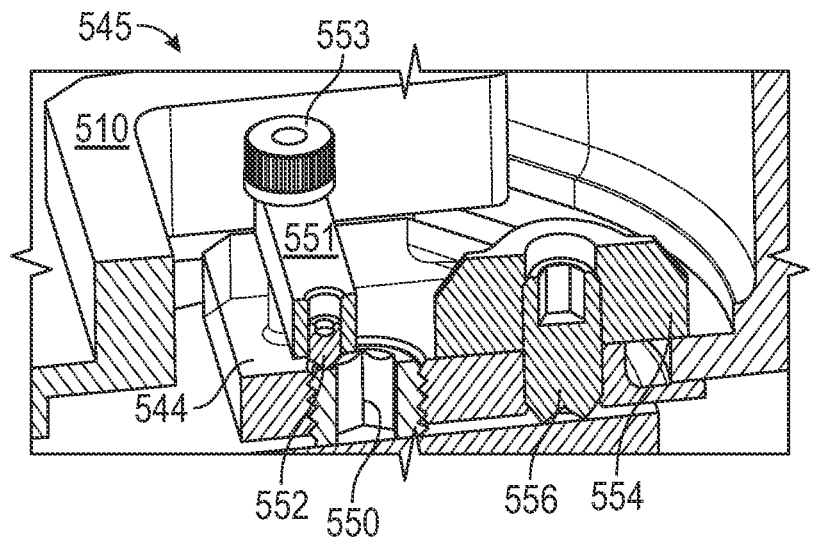

FIGS. 13A-13C depict schematic views of a cleat assembly 545, according to one or more embodiments described and discussed herein. The cleat assembly 545 contains a cleat 546 coupled to an upper surface 541 of the heater arm 542. In some embodiments, the cleat assembly 545 includes one or more fasteners 548. Each of the fastener 548 can independently be or include a bolt or a screw. In some examples, each of the fasteners 548 can be a set screw, a locking set screw, a pilot screw, a shoulder screw, or the like. In one or more embodiments, the cleat assembly 545 further includes a set screw, a shoulder screw, a bridge bar, and a locking set screw. For example, the cleat assembly 545 can include two or more set screws and two or more shoulder screws.

Figure 14A:
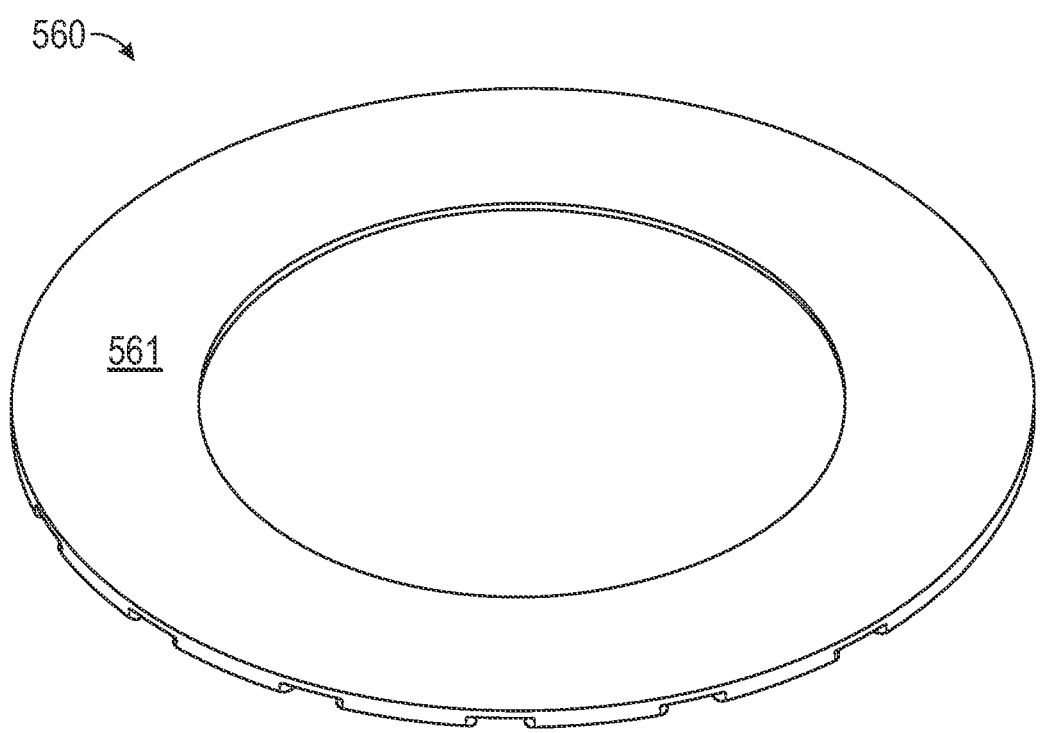
FIGS. 14A-14C depict schematic views of a heater support plate, according to one or more embodiments described and discussed herein.
Figure 14B:
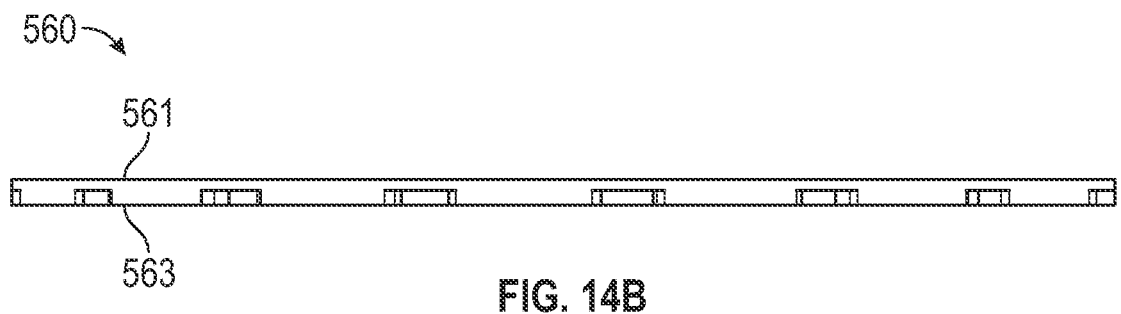
Figure 14C:
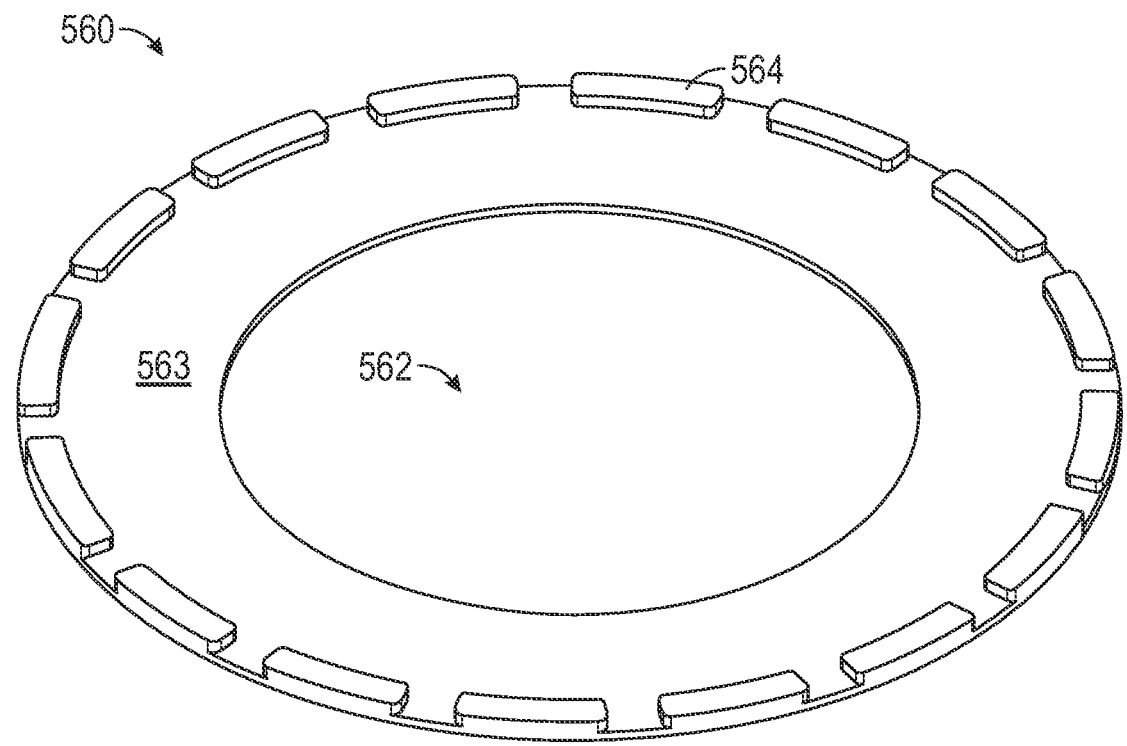

FIGS. 14A-14C depict schematic views of the heater support plate 560, according to one or more embodiments described and discussed herein. The heater support plate 560 has an upper surface 561 and a lower surface 563, as depicted in FIGS. 14A and 14C, respectively. FIG. 14B depicts a cross-sectional view of the heater support plate 560. The heater support plate 560 is a ring and has an orifice or hole 562 extending though the heater support plate 560 between the upper surface 561 and the lower surface 563. One or more raised features 562 extend from the lower surface 563 and are disposed around the outer edge of the heater support plate 560.

The heater support plate 560 provides physical support on the outer edge of the heater plate 532. The attachment assembly 535 provides axial force downwardly on the heater plate 532 and the heater support plate 560 maintains the heater plate 532 from bowing or deforming under the axial force. The heater support plate 560 contains one or more materials, such as quartz, silica or silicon dioxide, alumina or aluminum oxide, aluminum nitride, aluminum oxynitride, yttria or yttrium oxide, one or more metals, silicates thereof, ceramics thereof, or any combination thereof. Exemplary metals contained in the heater support plate 560 can be or include steel, stainless steel, iron, chromium, nickel, aluminum, alloys thereof, or any combination thereof.

Figure 15A:
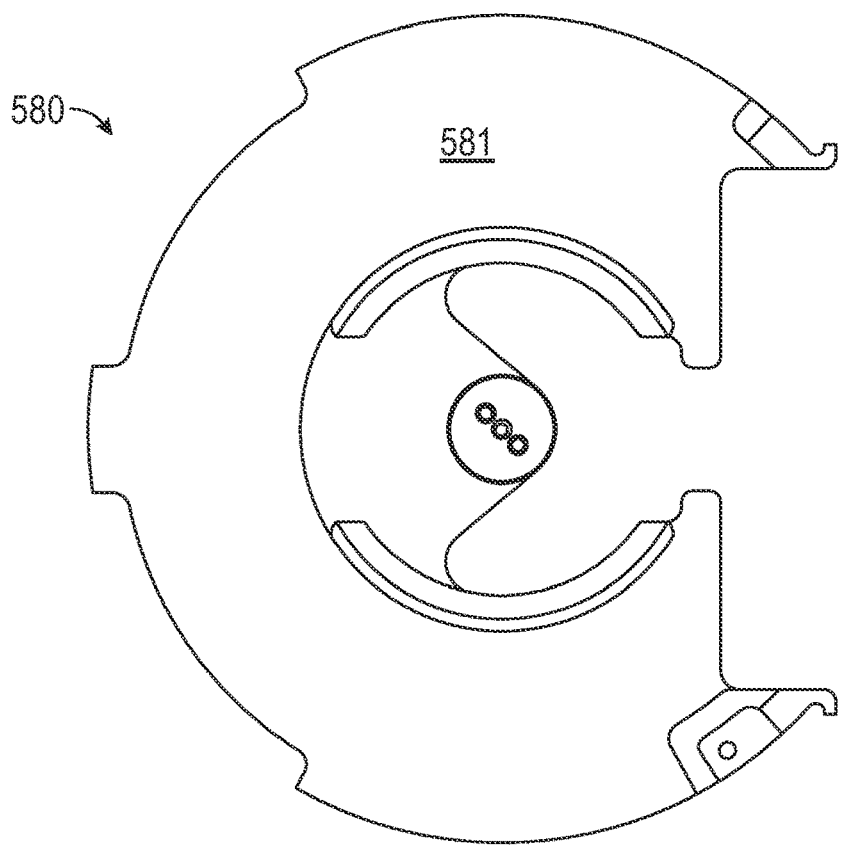
FIGS. 15A-15B depict schematic views of a lower support plate, according to one or more embodiments described and discussed herein.
Figure 15B:
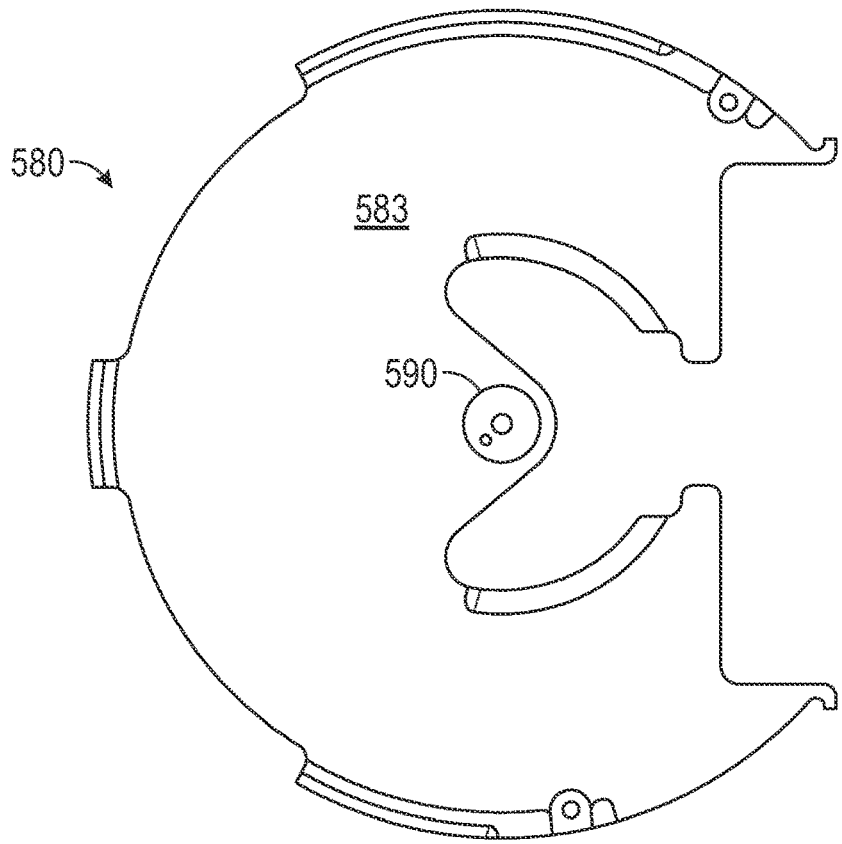

FIGS. 15A-15B depict schematic views of the lower support plate 580, according to one or more embodiments described and discussed herein. The lower support plate 580 has an upper surface 581 and a lower surface 583, as depicted in FIGS. 15A and 15B, respectively. The lower support plate 580 can include one or more materials, such as steel, stainless steel, iron, chromium, nickel, aluminum, alloys thereof, or any combination thereof.

In one or more embodiments, the support structure for the heater is helpful in the bevel etch chamber. When operating the heater at higher temperatures and spacing requirement is stringent (±few mils)—then the heater surfaces can be supported by the heater support plate. The gas purge flow is through the center of the mask and $O_2/N_2$ radical flows is at the wafer bevel surface. The operating spacing condition between wafer and mask is at a distance of about 5 mils to about 20 mils but with a spacing tolerance of ±about 1 mil. In some examples, if the spacing is not maintained then there is can be an impact on the bevel etching performance and chamber productivity. The heater support plate helps maintain the desired spacing.

Since the etching happens on the wafer bevel surface, the support structure is more robust at the edge of the heater as shown in the Figures. Therefore the heater support plate is used below the heater edge surface. In some examples, the heater support plate contains materials that can operate at high temperature without deformation, such as quartz, steel or other metal, AlOx, AlN, or combinations thereof. In some configurations, the heater support plate is used to support the heater surface and also can provide a uniform pumping channel below the heater surface. The heater is spring loaded at the center.

The heater support plate provides the robustness of making the bevel etch performance more uniform and does not allow any heater deformation/creep as a function of wafer cycling.

The heater support plate can be in any geometrical design below the heater. It can either be bonded or clamped or just put in placed below the heater surface. The heater support plate can either be uniform on the edge or on either heater structure or only in the center.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise, whenever a composition, an element, or a group of elements is preceded with the transitional phrase "comprising", it is understood that the same composition or group of elements with transitional phrases "consisting essentially of", "consisting of", "selected from the group of consisting of", or "is" preceding the recitation of the composition, element, or elements and vice versa, are contemplated.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

The invention claimed is:

1. A heater support kit, comprising:
    a heater assembly comprising a heater plate having an upper surface and a lower surface;
    a chuck ring disposed on at least a portion of the upper surface of the heater plate;
    a heater arm assembly comprising a heater arm having an upper surface, wherein the upper surface of the heater arm is substantially in contact with at least a portion of the lower surface of the heater plate and supporting the heater assembly; and
    a heater support plate disposed between the heater plate and the heater arm.

2. The heater support kit of claim 1, further comprising a lower support plate disposed below the heater support plate.

3. The heater support kit of claim 2, further comprising a centering plug disposed below the lower support plate.

4. The heater support kit of claim 2, wherein the lower support plate comprises steel, stainless steel, iron, chromium, nickel, aluminum, alloys thereof, or any combination thereof.

5. The heater support kit of claim 1, further comprising a centering plug disposed below the heater support plate.

6. The heater support kit of claim 1, further comprising an attachment assembly coupling together the heater plate and a centering plug.

7. The heater support kit of claim 6, wherein the attachment assembly comprises a clamping plug, a fastener, and an actuating device.

8. The heater support kit of claim 7, wherein the attachment assembly comprises two or more fasteners and two or more actuating devices.

9. The heater support kit of claim 7, wherein the fastener comprises a bolt or a screw, and the actuating device comprises a spring.

10. The heater support kit of claim 9, wherein the spring is a wave spring.

11. The heater support kit of claim 1, wherein the heater arm assembly further comprises a cleat coupled to an upper surface of the heater arm.

12. The heater support kit of claim 11, wherein the cleat further comprises a set screw, a shoulder screw, a bridge bar, and a locking set screw.

13. The heater support kit of claim 12, wherein the cleat further comprises two or more set screws and two or more shoulder screws.

14. The heater support kit of claim 1, wherein the heater arm assembly further comprises a heater cooling shaft coupled to a lower surface of the heater arm.

15. The heater support kit of claim 1, further comprising a pumping plate coupled to the heater arm assembly.

16. The heater support kit of claim 1, wherein the heater support plate comprises quartz, silica, silicon dioxide, alumina, aluminum oxide, aluminum nitride, aluminum oxynitride, yttria, yttrium oxide, a metal, a silicate thereof, a ceramic thereof, or any combination thereof.

17. A heater support kit, comprising:
    a heater assembly comprising a heater plate having an upper surface and a lower surface;
    a chuck ring disposed on at least a portion of the upper surface of the heater plate;
    a heater arm assembly comprising a heater arm having an upper surface, wherein the upper surface of the heater arm is substantially in contact with at least a portion of the lower surface of the heater plate and supporting the heater assembly;
    a heater support plate disposed between the heater plate and the heater arm; and
    a lower support plate disposed below the heater support plate.

18. The heater support kit of claim 17, wherein the heater support plate comprises quartz, silica, silicon dioxide, alumina, aluminum oxide, aluminum nitride, aluminum oxynitride, yttria, yttrium oxide, a metal, a silicate thereof, a ceramic thereof, or any combination thereof.

19. The heater support kit of claim 18, wherein the lower support plate comprises steel, stainless steel, iron, chromium, nickel, aluminum, alloys thereof, or any combination thereof.

20. A heater support kit, comprising:
a heater assembly comprising a heater plate having an upper surface and a lower surface;
a chuck ring disposed on at least a portion of the upper surface of the heater plate;
a heater arm assembly comprising a heater arm having an upper surface, wherein the upper surface of the heater arm is substantially in contact with at least a portion of the lower surface of the heater plate and supporting the heater assembly; and
a heater support plate disposed between the heater plate and the heater arm and in contact with at least a portion of the lower surface of the heater plate.

* * * * *